(12) United States Patent
Rhodes et al.

(10) Patent No.: US 7,157,302 B2
(45) Date of Patent: Jan. 2, 2007

(54) IMAGING DEVICE AND METHOD OF MANUFACTURE

(75) Inventors: Howard E. Rhodes, Boise, ID (US); Edward J. Heitzeberg, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 114 days.

(21) Appl. No.: 10/284,248

(22) Filed: Oct. 31, 2002

(65) Prior Publication Data

US 2003/0047790 A1  Mar. 13, 2003

Related U.S. Application Data

(62) Division of application No. 09/090,315, filed on Jun. 4, 1998.

(51) Int. Cl.
*H01L 21/00* (2006.01)

(52) U.S. Cl. ............................. 438/70; 438/57; 438/64

(58) Field of Classification Search .................. 438/57, 438/64, 70
See application file for complete search history.

(56) References Cited

U.S. PATENT DOCUMENTS

| | | | |
|---|---|---|---|
| 4,305,204 A | | 12/1981 | Toggart et al. |
| 4,388,128 A | * | 6/1983 | Ogawa et al. ................ 156/64 |
| 4,441,125 A | | 4/1984 | Parkinson |
| 4,554,126 A | * | 11/1985 | Sera ...................... 264/272.17 |
| 4,631,636 A | * | 12/1986 | Andrews .................... 361/699 |
| 4,663,656 A | | 5/1987 | Elabd et al. |
| 4,721,453 A | * | 1/1988 | Belanger, Jr. ................ 425/94 |
| 4,733,065 A | | 3/1988 | Hoshi et al. |
| 4,827,118 A | | 5/1989 | Shibata et al. |
| 5,021,864 A | | 6/1991 | Kelly et al. |
| 5,053,298 A | | 10/1991 | Park et al. |
| 5,115,299 A | | 5/1992 | Wright |
| 5,278,009 A | | 1/1994 | Iida et al. |
| 5,283,691 A | | 2/1994 | Ogasawara |
| 5,461,425 A | | 10/1995 | Fowler et al. |
| 5,472,646 A | * | 12/1995 | Uchida et al. ................ 264/1.7 |
| 5,504,514 A | | 4/1996 | Nelson |
| 5,506,445 A | | 4/1996 | Rosenberg |
| 5,596,228 A | | 1/1997 | Anderton et al. |
| 5,597,422 A | | 1/1997 | Kataoka et al. |
| 5,644,169 A | | 7/1997 | Chun |
| 5,668,596 A | | 9/1997 | Vogel |
| 5,674,785 A | | 10/1997 | Akram et al. |

(Continued)

FOREIGN PATENT DOCUMENTS

JP    56-090568    7/1981

OTHER PUBLICATIONS

"A Pre-Molded Plastic Package for Polaroid CCD Devices," MicroNews, Third Quarter 1997, vol. 3, No. 3.

*Primary Examiner*—Long Pham
(74) *Attorney, Agent, or Firm*—Dickstein Shapiro LLP

(57) ABSTRACT

An imaging chip is packaged in transparent injection molded material. The chip may have photosensitive elements arranged in a two-dimensional array on semiconductor material. Each element corresponds to a pixel of an image. The package may be formed of epoxy resin. In one aspect of the invention, the transparent plastic material provides a color filter. Second and third packages with complementary color filters may be used to provide signals for a color imaging system. In another aspect of the invention, a lens is integrated into the plastic package. In another aspect of the invention, a semiconductor chip is applied to a pre-formed plastic package by bump bonding.

9 Claims, 5 Drawing Sheets

U.S. PATENT DOCUMENTS

| | | |
|---|---|---|
| 5,708,263 A | 1/1998 | Wong |
| 5,811,320 A | 9/1998 | Rostoker |
| 5,834,799 A | 11/1998 | Rostoker et al. |
| 5,933,183 A | 8/1999 | Enomoto et al. |
| 6,028,708 A | 2/2000 | Gramann et al. |
| 6,051,848 A | 4/2000 | Webb |
| 6,169,295 B1 | 1/2001 | Koo |
| 6,291,811 B1 | 9/2001 | Ogawa |
| 6,491,222 B1 | 12/2002 | Dvorkis et al. |

* cited by examiner

IMAGING DEVICE AND METHOD OF MANUFACTURE

CROSS-REFERENCE TO RELATED APPLICATIONS

This application is a divisional application of U.S. patent application Ser. No. 09/090,315, filed Jun. 4, 1998.

BACKGROUND OF THE INVENTION

1. Field of the Invention

The present invention relates generally to imaging devices. The invention also relates to methods of packaging such devices. More particularly, the invention relates to a transparent plastic package for supporting and/or protecting a photosensitive semiconductor device.

2. Discussion of the Related Art

Solid-state imaging devices are known in the art. They are used to generate electrical signals representative of an incident image. The devices may be responsive to visible, ultraviolet and/or infrared radiation. The devices may also be used to generate color component signals. Solid-state imaging devices are described in U.S. Pat. No. 5,708,263 (Wong), U.S. Pat. No. 5,461,425 (Fowler et al.) and U.S. Pat. No. 4,441,125 (Parkinson).

Prior art imaging devices are packaged in ceramic and glass plate structures. Such packages are generally cumbersome and inconvenient, and the materials are relatively expensive. In addition, the known packages require complicated methods of assembly. A ceramic housing must first be produced. The ceramic housing is used to provide support for the glass plate. The housing must be carefully constructed to ensure proper alignment of the imaging device and the glass plate. Then, the imaging device is secured within the ceramic housing. The imaging device needs to be properly aligned in the housing to avoid misalignment with the plate, which could cause optical distortion. And before the glass plate is applied, steps must be taken to provide electrical communication from the leads of the imaging device to the exterior of the solid ceramic housing.

Then, the glass plate is applied and it is necessary to permanently secure the plate to the housing. The connection between the glass plate and the housing must be permanent and air tight. In addition, there should be no misalignment of or damage to the plate. All of these steps must be done in a contaminant-free environment. Dust or other contaminants on the imaging device or inside the glass plate could degrade the performance of the device. The various steps may require different machinery. Consequently, it may be necessary to move partially assembled parts from one machine to another.

There is a need in the art for imaging devices that are constructed of low-cost materials. There is also a need in the art for an uncomplicated method of packaging imaging devices. There is also a need in the art for a packaging system that is readily adaptable to existing machinery and skills in the semiconductor device manufacturing industry.

SUMMARY OF THE INVENTION

The disadvantages of the prior art are overcome to a great extent by packaging an imaging chip in transparent plastic material. The chip may have photosensitive elements located on semiconductor material. The package may be formed of relatively inexpensive injection molded resin. In one aspect of the invention, the resin is a thermosetting epoxy resin. In another aspect of the invention, the photosensitive elements are arranged in a two-dimensional array. Each element corresponds to a pixel of an image.

In another aspect of the invention, the transparent plastic material provides a color filter. Second and third packages with complementary color filters may be used to provide complementary signals in a color imaging system.

The present invention also relates to an imaging device that has a package formed of transparent plastic material and a semiconductor chip located within the package. The chip has an array of photosensitive elements for generating electrical signals corresponding to an image. The photosensitive elements are covered by the transparent plastic material.

In one aspect of the invention, a lens is incorporated into the plastic package. The lens transmits the image onto the photosensitive elements. The lens may be formed by injection molding.

The present invention also relates to a system that has an image source for transmitting an image, a semiconductor device for responding to the image, and a package for protecting and supporting the semiconductor device. The package is formed of injection molded transparent plastic material. The image is transmitted through the plastic material.

The present invention also relates to a method of making a packaged imaging device. The method includes the following steps: locating an integrated circuit in a mold; injecting transparent resin into the mold such that the integrated circuit is covered by the resin; curing the resin; and removing the finished product from the mold. In one aspect of the invention, a release agent is applied to the mold for easy removal of the finished product.

In another aspect of the invention, a semiconductor chip is applied to a pre-formed plastic package by bump bonding. The package may be formed of injection molded transparent plastic.

These and other features and advantages of the invention will become apparent from the following detailed description of preferred embodiments of the invention.

DETAILED DESCRIPTION OF PREFERRED EMBODIMENTS

Figure 1:
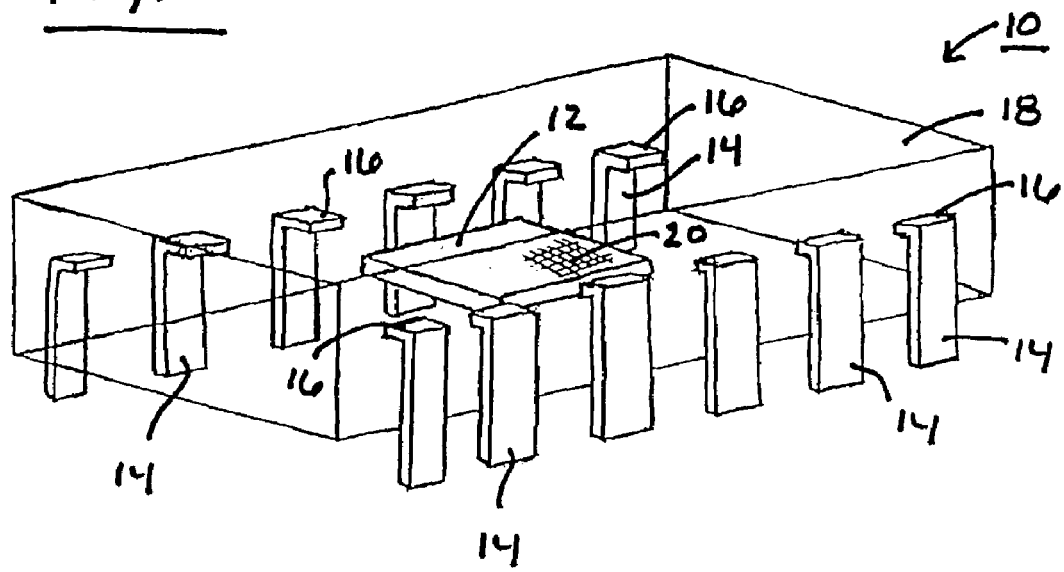
FIG. 1 is a isometric view of an imaging device constructed in accordance with the present invention.

Referring now to the drawings, where like reference numerals designate like elements, there is shown in FIG. 1 an imaging device 10 constructed in accordance with the present invention. The device 10 has a semiconductor chip 12 and metal leads 14. The inner ends 16 of the leads 14 are connected to the chip 12 by suitable lead wires. The lead wires are not shown in FIG. 1.

The chip 12, the lead wires, and the inner ends 16 of the leads 14 are completely encapsulated in a transparent plastic package 18. The package 18 provides structural support for the chip 12, the lead wires and the leads 14. In addition, the package 18 protects the chip 12 from the environment. Other features and advantages of the transparent package 18 are described in more detail below.

The chip 12 may be formed of semiconductor material. The chip 12 may be, for example, a complementary metal oxide semiconductor (CMOS) device. The chip 12 has photosensitive elements 20 for receiving radiant energy from an image source and for generating corresponding electrical signals. The photosensitive elements 20 are covered by the transparent package 18. Suitable circuitry (not illustrated) may also be integrated into the chip 12.

The photosensitive elements 20 may be in a suitable two-dimensional array. For example, the elements 20 may be arranged in a 480×640 array. The invention should not be limited, however, to the number or particular arrangement of photosensitive elements 20 on the chip 12. More or less elements 20 may be used to practice the invention.

The photosensitive elements 20 generate pixel signals representative of the radiant image that is incident on the surface of the chip 12. The signals are transmitted through the wires and the leads 14, and processed to reconstruct a version of the image at a remote location. Thus, the imaging device 10 may be used, for example, in a digital electronic camera. The invention should not be limited, however, to any particular field of use. The invention may be used in a wide variety of radiation sensing systems, image processing systems and other systems.

In the illustrated embodiment, the package 18 is formed of a clear epoxy resin. Other thermosetting resins, or other plastic materials, including thermoplastic resins, may be used if desired. The coefficient of expansion for the plastic material may be substantially different than that of the chip 12.

The device 10 may be economically manufactured by injection molding. In operation, the chip 12, the wires (not shown in FIG. 1) and the leads 14 are assembled and located in a suitable mold (not illustrated). Epoxy resin is injected into the mold to completely and integrally surround the chip 12, the wires and the inner ends 16 of the leads 14. The epoxy resin is then cured to form the rigid, self-supporting package 18. Note that the wires between the chip 12 and the leads 14 are not shown in FIG. 1 in order to better show the manner in which the chip 12 is encased in transparent plastic material.

Preferably, the injection molding process is controlled to maintain the transparency of the plastic material over the photo-sensitive elements 20. For example, the formation of bubbles in the plastic material near the photosensitive elements 20 should preferably be avoided. Such bubbles may affect the resolution of the imaging device 10. For certain uses, however, where high resolution is not required, small bubbles and other imperfections in the molded plastic package 18 may be tolerated.

Figure 2:
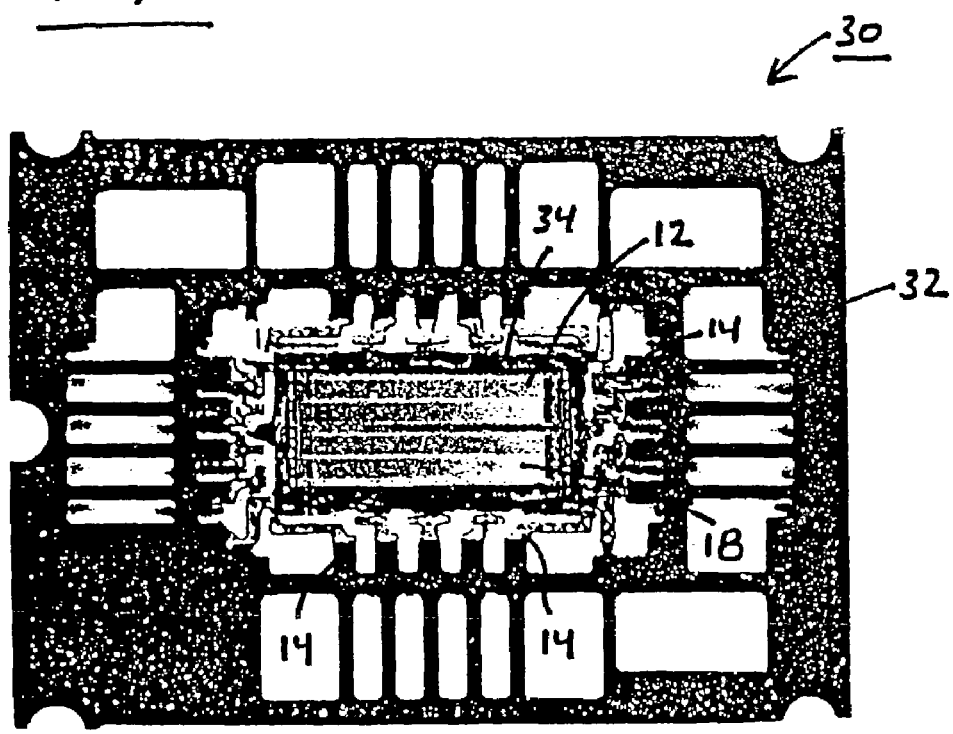
FIG. 2 is a top view of another imaging device constructed in accordance with the invention, at an intermediate stage of manufacture.

FIG. 2 shows another imaging device 30 constructed in accordance with the invention. The device 30 is formed by injection molding the package 18 on a lead frame 32. The lead frame 32 has a paddle 34 for supporting the chip 12. Lead frames of the type shown in FIG. 2 are disclosed for example in U.S. Pat. No. 5,021,864 (Kelly).

To manufacture the device 30, the chip 12 is adhesively attached to the paddle 34. Wires from pads on the chip 12 are bonded to the respective leads 14 on the lead frame 32. The assembly 12, 32 is then located in a mold (not illustrated). Clear epoxy is injected into the mold and cured to form the package 18. The lead frame 32 is then trimmed away at the outer ends of the leads 14 to produce the finished product.

Preferably, the transparent molded material completely surrounds the top surface of the chip 12, the bottom surface of the paddle 34, and the inner ends 16 of the leads 14. The plastic material may fill the spaces between the inner ends 16 of the leads 14 to provide a rugged, integrated assembly. The advantages, features and uses of the imaging device 10 shown in FIG. 1 are applicable to the imaging device 30 shown in FIG. 2.

Figure 3:
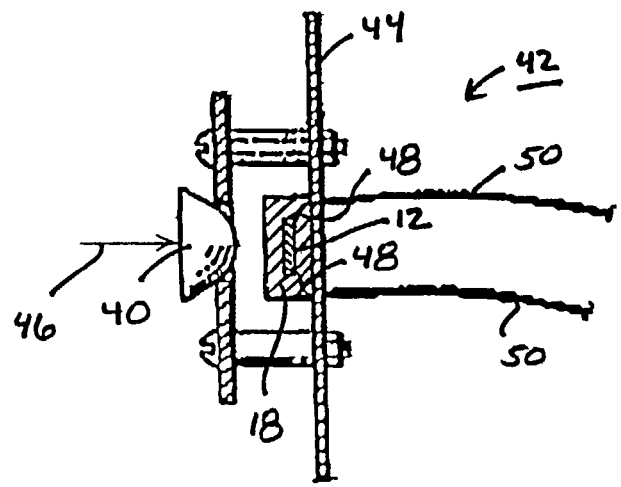
FIG. 3 is a cross-sectional view of an imaging system constructed in accordance with the invention.

As shown in FIG. 3, the imaging device 10 may be assembled adjacent a lens 40 to provide an imaging system 42. A suitable support structure 44 may be provided to support the imaging device 10 and the lens 40. The lens 40 provides an image source for the system 42. In operation, radiation 46 incident on the lens 40 is imaged on the surface of the chip 12. The photosensitive elements generate pixel signals representative of the image. The signals are transmitted through lead wires 48 and signal wires 50 for processing.

Figure 4:
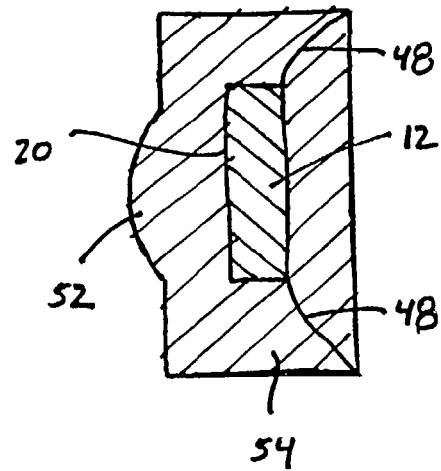
FIG. 4 is a cross-sectional view of another imaging device constructed in accordance with the invention.

Referring now to FIG. 4, a lens 52 may be molded into a plastic package 54. The lens 52 may be formed during the injection molding of the package 54, as a single step operation. The package 54 is the same as the package 18 shown in FIG. 1 except for the integrally molded lens 52. The lens 52 may be used instead of or as a complement to the lens 40 of FIG. 3.

Figure 5:
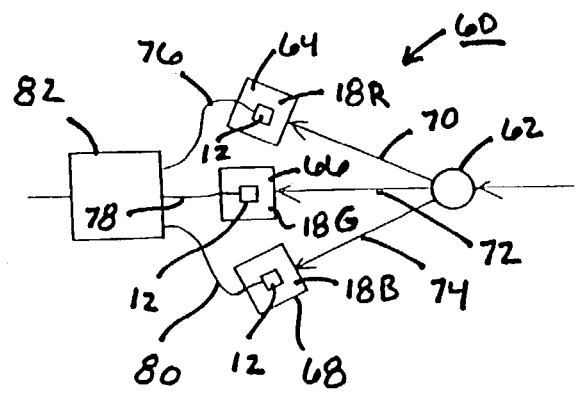
FIG. 5 is a schematic view of another imaging system constructed in accordance with the invention.

FIG. 5 shows a color imaging system 60. The system 60 has a beam splitter 62 and first, second and third component imaging devices 64, 66, 68. The beam splitter 62 transmits the same image onto each of the component imaging devices 64, 66, 68. The split beams of radiation are designated by arrows 70, 72, 74. The component imaging devices 64, 66, 68 may be identical to the imaging devices 10, 30 discussed above, except that the molded packages 18R, 18G, 18B for the devices 64, 66, 68 are formed of red, green and blue transparent plastic, respectively. The colored packages 18R, 18G, 18B provide respective color component filters.

Thus, the chip 12 for the first component imaging device 64 receives only the red component of the image from the beam splitter 62. The chips 12 for the second and third imaging devices 66, 68 receive only green and blue components of the image, respectively. Signals from the three imaging devices 64, 66, 68 may be combined via signal lines 76, 78, 80 to produce a color version of the image at a remote location 82.

The component imaging devices 64, 66, 68 shown in FIG. 5 may be provided with integrally molded lenses 52 of the type shown in FIG. 4. The devices 64, 66, 68 may also be used with a separate lens 40 of the type shown in FIG. 3. In each case, the devices 64, 66, 68 may be molded with or without a paddle lead frame 32.

In an alternative embodiment of the invention, the red, green and blue color filters integrated into the packages 18 may be replaced by subtractive cyan, magenta and yellow transparent packages. The transparent plastic for the packages may be colored with a variety of different colors depending on the parameters of the system within which the imaging devices are used.

Figure 6:
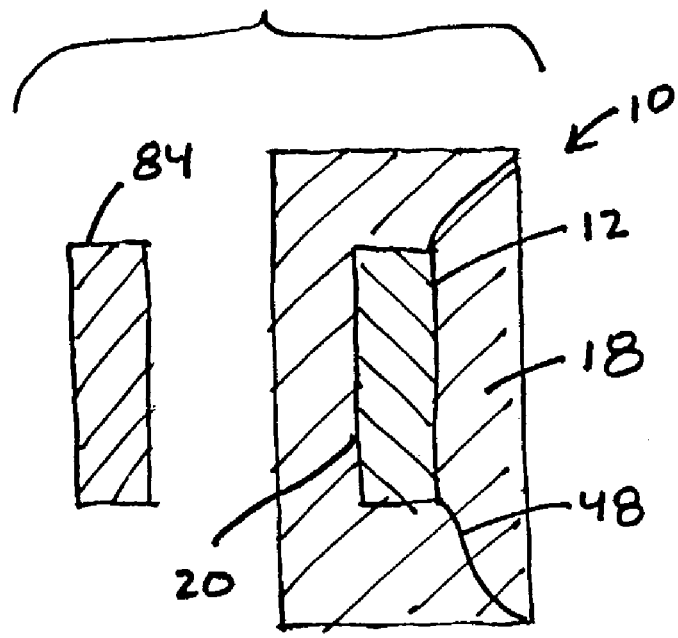
FIG. 6 is a cross-sectional view of another imaging system constructed in accordance with the invention.

In an alternative embodiment of the invention, a single imaging device 10 may be associated with a color filter array (CFA) 84 (FIG. 6). An example of a color filter array is shown in U.S. Pat. No. 5,668,596 (Vogel). The color filter array 84 may provide a separate color filter (red, green or blue) for each pixel of the image. The individual filters on the color filter array 84 are aligned with the photosensitive elements 20 on the chip 12 such that the single chip may be used for color image processing. In the embodiment shown in FIG. 6, the plastic material making up the package 18 is clear (with no color).

Figure 7:
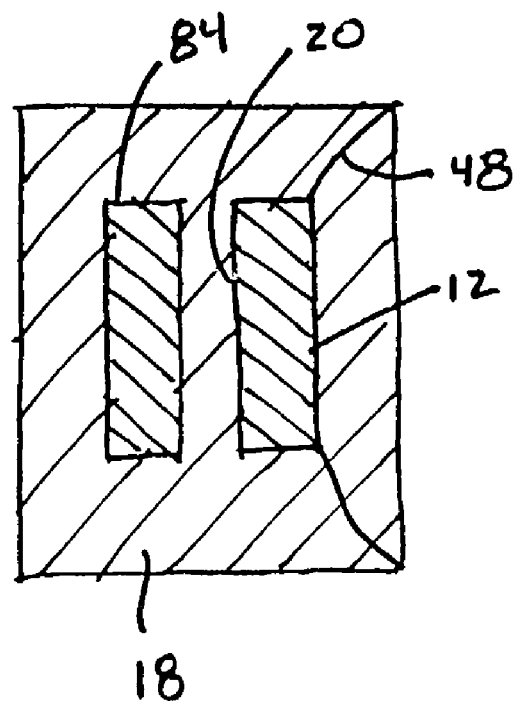
FIG. 7 is a cross-sectional view of yet another imaging device constructed in accordance with the invention.

Referring now to FIG. 7, in another embodiment of the invention, the color filter array 84 may be located within and entirely surrounded by the plastic material of the package 18. As in the embodiment of FIG. 6, the individual filters of the color filter array 84 are aligned with the respective photosensitive elements 20 on the chip 12 for color processing.

Figure 8:
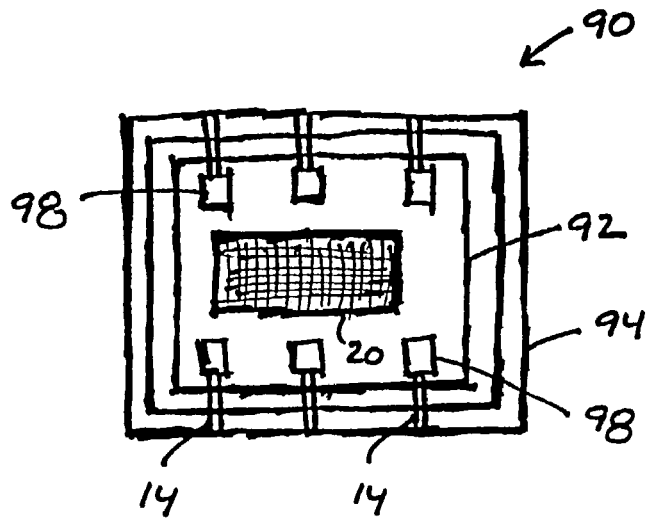
FIG. 8 is a bottom view of yet another imaging device constructed in accordance with the invention.
Figure 9:
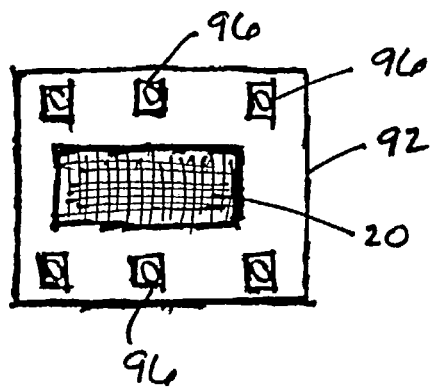
FIG. 9 is a top view of the imager chip for the device of FIG. 8.
Figure 10:
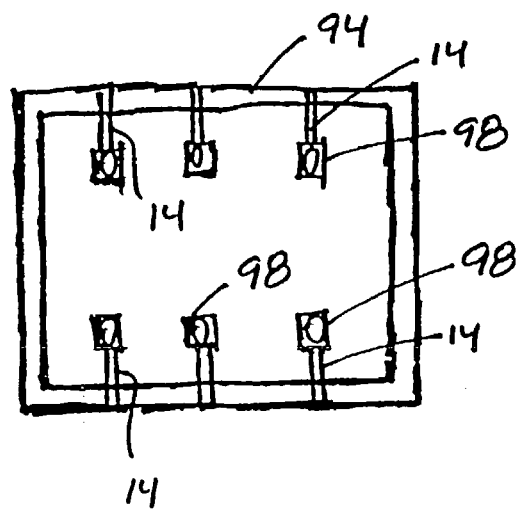
FIG. 10 is a top view of the package for the device of FIG. 8.

Referring now to FIGS. 8–10, another imaging device 90 constructed in accordance with the invention is formed by bump bonding a semiconductor chip 92 onto a pre-molded plastic package 94. FIG. 9 shows the chip 92 by itself, before the chip 92 is bonded to the package 94. The chip 92 generally has the features and advantages of the chip 12 discussed above. In addition, the chip 92 has bond pads 96. The pre-molded package 94 is shown in FIG. 10. The package 94 may be formed of the transparent epoxy material discussed above. In addition, the package 94 has bond pads 98 for providing electrical connections to respective metal leads 14. The preferred method of making the imaging device 90 is described in more detail below.

To manufacture the imaging device 90, the leads 14 and the bond pads 98 for the package 94 are assembled in a mold (not illustrated). Transparent epoxy resin (or another moldable material) is injected into the mold. The plastic material is cured to form a structure that rigidly supports the leads 14 and the bond pads 98. The chip 92 is then flipped and bump bonded onto the pads 98. The pads 96 on the chip 92 are soldered to the pads 98 on the package 94 to establish electrical connections between the photosensitive elements 20 and the leads 14. If desired, a suitable resin may be applied to the back surface of the chip 92 to complete the device 90.

In an alternative embodiment of the invention, the package 94 may be colored for use in a color imaging system of the type shown in FIG. 5. The packages 94 may be formed with or without integral lenses 52 of the type shown in FIG. 4.

Figure 11:
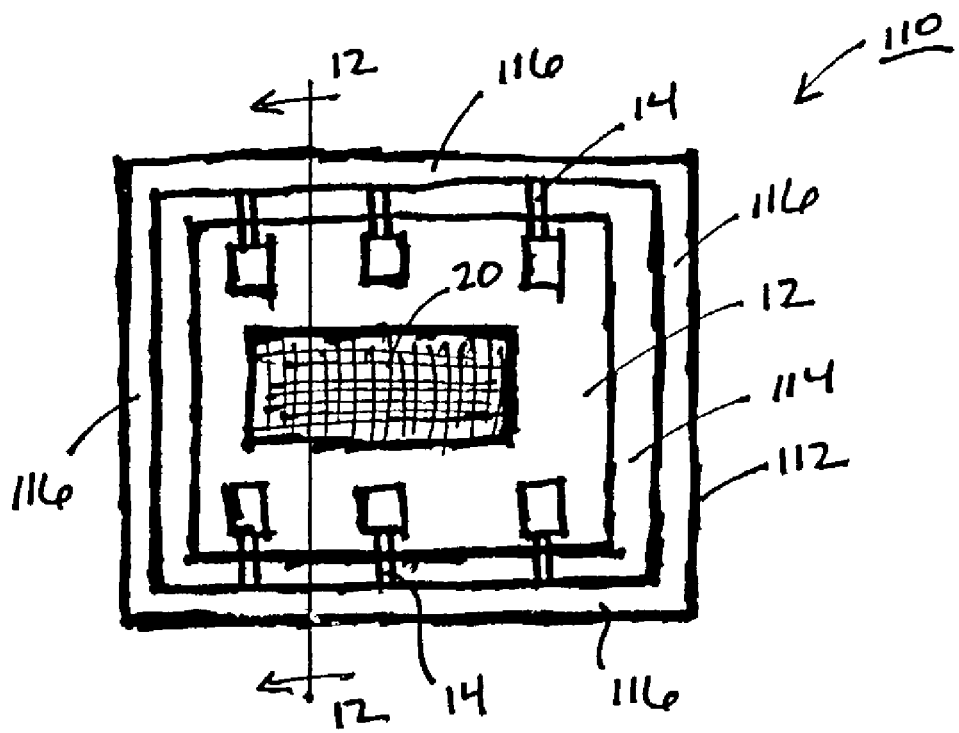
FIG. 11 is a top view of yet another imaging device constructed in accordance with the invention.
Figure 12:
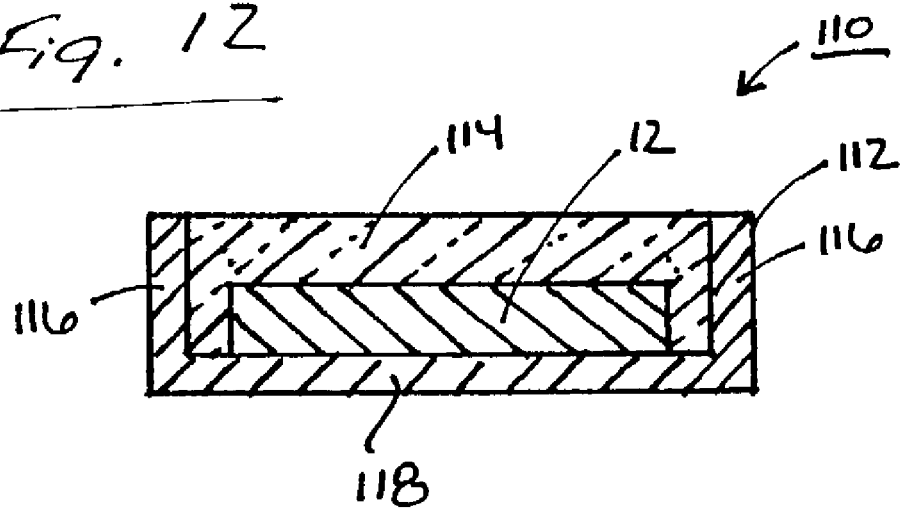
FIG. 12 is a cross-sectional view of the imaging device of FIG. 10, taken along the line 12—12.

Referring now to FIGS. 11 and 12, another imaging device 110 constructed in accordance with the present invention includes a housing 112, a chip 12, and a molded transparent plastic cover 114. The photosensitive elements 20 are connected to suitable leads 14 on the chip 12.

To manufacture the device 110, the rigid housing 112 may be made of ceramic or molded plastic. The chip 12 is then located in the housing 112 and connected to the leads 14. The cover 114 may then be formed by injecting molten epoxy resin (or another suitable plastic material) into the housing 112. The molten material encapsulates the chip 12 and the leads 14.

The molten material may be conveniently contained within the housing 112 during the molding process by the side walls 116 of the housing 112. The housing 112 has a closed bottom 118 to prevent molten plastic from draining out of the housing 112 by gravity. Thus, the housing 112 serves as a mold during the formation of the cover 114.

The molten plastic material is cured or hardened to produce a rugged, integrated final product. The solid plastic material 114 secures the chip 12 in place within the housing 112 and protects the chip 12 from the environment.

The cover 114 may be clear or colored, as in the embodiments discussed above. A lens 52 may be molded into the cover 114, if desired. A color filter array 84 of the type shown in FIG. 7 may be molded into the cover 114, if desired.

The above descriptions and drawings are only illustrative of preferred embodiments which achieve the features and advantages of the present invention, and it is not intended that the present invention be limited thereto. Any modification of the present invention which comes within the spirit and scope of the following claims is considered part of the present invention.

What is claimed as new and desired to be protected by Letters Patent of the United States is:

1. A method of making an image device, comprising the steps of:
    locating a semiconductor device in a mold, said device including an integrated circuit and photosensitive elements;
    injecting transparent resin into said mold such that said integrated circuit and said photosensitive elements are covered by said transparent resin;
    providing a color filter by coloring said transparent resin; and
    subsequently, removing said semiconductor device from said mold.

2. The method of claim 1, further comprising the steps of applying a release agent to said mold, wherein said step of applying a release agent occurs prior to said step of injecting said transparent resin into said mold.

3. The method of claim 1, further comprising the steps of attaching leads to said semiconductor device, said leads being partially encapsulated in said transparent resin.

4. The method of claim 3, wherein said transparent resin is a thermosetting resin, and further comprising the step of curing said thermosetting resin to form a package encapsulating said semiconductor device.

5. The method of claim 4, further comprising the step of forming a lens in said package.

6. A method of making an imaging device, comprising the steps of:
    locating leads and bond pads in a mold, said leads being connected respectively to an associated bond pad;
    injecting transparent resin into said mold such that inner ends of said leads are encapsulated in said resin, outer ends of said leads and portions of said bond pads remaining exposed outside said resin;
    curing said resin to form a plastic package supporting said leads and bond pads; and
    subsequently, bump bonding a semiconductor device to said bond pads to electrically connect said semiconductor device to said leads.

7. The method of claim 6, wherein said semiconductor device includes photosensitive elements.

8. The method of claim 7, wherein said resin is a clear epoxy resin.

9. A method of making an image device, comprising the steps of:

locating a semiconductor device in a mold, said device including an integrated circuit and photosensitive elements;

attaching leads to said semiconductor device, injecting a colored transparent thermosetting resin into said mold such that said integrated circuit and said photosensitive elements are covered by said transparent resin;

curing said thermosetting resin to form a package encapsulating said semiconductor device, said package providing a color filter in said transparent resin.

* * * * *